United States Patent [19]
Hung et al.

[11] Patent Number: 6,104,665
[45] Date of Patent: Aug. 15, 2000

[54] ENHANCED WORD LINE DRIVER TO REDUCE GATE CAPACITANCE FOR LOW VOLTAGE APPLICATIONS

[75] Inventors: Chun Hsiung Hung; I-Long Lee, both of Hsinchu; Tien-Shin Ho, Hsin-Tien, all of Taiwan; Ray-Lin Wan, Fremont, Calif.

[73] Assignee: Macronix International Co., Ltd., Hsinchu, Taiwan

[21] Appl. No.: 09/269,983

[22] PCT Filed: Dec. 4, 1998

[86] PCT No.: PCT/US98/25809

§ 371 Date: Apr. 5, 1999

§ 102(e) Date: Apr. 5, 1999

[51] Int. Cl.[7] .................................................. G11C 8/00
[52] U.S. Cl. ...................... 365/230.06; 365/102; 365/104
[58] Field of Search .......................... 365/230.06, 185.23, 365/102, 104

[56] References Cited

U.S. PATENT DOCUMENTS

| | | | |
|---|---|---|---|
| 5,263,001 | 11/1993 | Youn et al. | 365/227 |
| 5,668,758 | 9/1997 | Yiu et al. | 365/185.23 |
| 5,751,643 | 5/1998 | Lines | 365/189.11 |
| 5,966,331 | 10/1999 | Shiau et al. | 365/185.23 |

*Primary Examiner*—David Nelms
*Assistant Examiner*—Thong Le
*Attorney, Agent, or Firm*—Mark A. Haynes; Haynes & Beffel LLP

[57] ABSTRACT

An enhanced word line driver circuit suitable for use on integrated circuits such as flash memory devices with voltage boosting includes a load reduction circuit. In response to a boosted voltage, the load reduction circuit decouples a gate capacitance load of deselected enhanced word line drivers from the boost voltage generator. The reduction of capacitive loading decreases power consumption and shortens the voltage boost time of the memory device.

26 Claims, 12 Drawing Sheets

ENHANCED WORD LINE DRIVER TO REDUCE GATE CAPACITANCE FOR LOW VOLTAGE APPLICATIONS

BACKGROUND OF THE INVENTION

1. Field of the Invention

The present invention relates to word line drivers powered by a power supply with limited current driving ability, such as a charge pump, in integrated circuit memory devices; and specifically to memory devices including word line drivers powered with a boosted voltage during a read mode.

2. Description of the Related Art

Decreased power consumption and faster operating speeds are continuing trends in integrated circuit design. Lower voltages generally result in lower power operation. Standards are emerging that power integrated circuits at voltages lower than the typical 5 volts at present. For example, one low supply voltage which is emerging as a standard is specified to operate over a range of about 2.7 to 3.6 volts. Other, even lower supply potential standards are emerging. Low voltage supply ranges fall short of voltages needed for important applications. For example, in semiconductor memory devices, such as flash EEPROM or ROM, word lines may operate at a read potential of 4 volts or more. Voltage supply boosting circuitry is included on the integrated circuit to supply the required on chip voltages. Such boosting circuits have limited current driving capability, and thus limit the speed of devices.

The performance of boosting circuits is also limited by capacitance, which includes parasitic capacitance and the capacitance of drivers which rely on the boosted voltage. During a voltage boosting step, capacitance delays the voltage boost operation and increases the power required from the voltage boost circuits. Some major sources of capacitance are well capacitance, interconnect capacitance, oxide capacitance, and junction capacitance. Accordingly, it is desirable to provide a circuit for use with integrated circuits that decreases capacitance generally, and particularly decreases the capacitive load on the boosted voltage source during voltage boost operations.

SUMMARY OF THE INVENTION

An enhanced word line driver is disclosed that reduces capacitance for voltage boosting applications. Capacitance for low voltage applications is reduced by a load reduction circuit in the enhanced word line driver, implemented in an integrated circuit that includes a memory array. The load reduction circuit reduces the capacitive load placed by deselected word line drivers on the voltage boost source, particularly when the magnitude of the output of the voltage boost source increases.

The word line driver circuit includes a voltage source, a driver circuit, a feedback circuit, and a load reduction circuit. The voltage source supplies a first voltage. The driver circuit has an input, a two power inputs, and an output. The output is coupled to a word line. The first power input is coupled to the voltage source. In a selected mode, the word line driver circuit couples the word line to the first power input. In a deselected mode, the word line driver circuit couples the word line to the second power input. The feedback circuit has an input, an output, and a power input. The input of the feedback circuit is coupled to the output of the driver circuit. The power input of the feedback circuit is coupled to the voltage source. The load reduction circuit has an input, an output, and a control input. The input of the load reduction circuit is coupled to the output of the feedback circuit. The output of the load reduction circuit is coupled to the input of the driver circuit. In the deselected mode, the load reduction circuit reduces a capacitive load of the driver circuit on the voltage source.

In a second embodiment of the invention, an integrated circuit memory device includes a memory array, a plurality of address inputs, a voltage source, a decoder, and a plurality of word line driver circuits coupled to the voltage source, many of which are deselected, and one or a few of which are selected in a given access to the array. The memory array has a plurality of word lines coupled to memory cells in the array. The plurality of address inputs is adapted to receive addresses identifying selected memory cells in the array. The voltage source supplies a voltage. The decoder selects a selected word line driver circuit. The deselected word line driver circuits capacitively load the voltage source. One or more word line driver circuits in the plurality of word line driver circuits respectively include a driver circuit, a feedback circuit, and a load reduction circuit. The driver circuit has an input, two power inputs, and an output. The output is coupled to a word line. The first power input is coupled to the voltage source. In a selected mode, the word line driver circuit couples the word line to the first power input. In a deselected mode, the word line driver circuit couples the word line to the second power input, which receives typically a ground potential or other reference potential. The feedback circuit has an input, an output, and a power input. The input of the feedback circuit is coupled to the output of the driver circuit. The power input of the feedback circuit is coupled to the voltage source. The load reduction circuit has an input, an output, and a control input. The input of the load reduction circuit is coupled to the output of the feedback circuit. The output of the load reduction circuit is coupled to the input of the driver circuit. The load reduction circuit reduces a capacitive load of the driver circuit on the voltage source.

In a third embodiment of the invention, a word line driver circuit includes a voltage source, a driver circuit, a feedback circuit, and a load reduction circuit. The driver circuit comprises a P-channel transistor and an N-channel transistor. The P-channel transistor includes a gate terminal, a first terminal coupled to the voltage source, and a second terminal adapted for connection to a word line. The N-channel transistor includes a gate terminal, a first terminal, and a second terminal coupled to the second terminal of the P-channel transistor. In a selected mode, the word line driver circuit couples the word line to the voltage source. In a deselected mode, the word line driver circuit couples the word line to a reference potential of the first terminal of the N-channel transistor. The feedback circuit comprises a P-channel transistor. The P-channel transistor includes a gate terminal coupled to the second terminal of the N-channel transistor of the driver circuit, a first terminal coupled to the voltage source, and a second terminal coupled to the gate of the P-channel transistor of the driver circuit. The load reduction circuit comprises an N-channel transistor. The N-channel transistor includes a control terminal, a first terminal coupled to the second terminal of the P-channel transistor of the feedback circuit, and a second terminal coupled to the gate of the N-channel transistor of the driver circuit. In the deselected mode, the load reduction circuit reduces a capacitive load of the driver circuit on the voltage source.

In a fourth embodiment of the invention, an integrated circuit memory device includes a memory array, a plurality of address inputs, a voltage source, a decoder, and a plurality of word line driver circuits coupled to the voltage source, many of which are deselected, and one or a few of which are selected in a given access to that array. The memory array has a plurality of word lines coupled to memory cells in the array. The plurality of address inputs is adapted to receive addresses identifying selected memory cells in the array. The decoder selects a selected word line driver circuit. The deselected word line driver circuits capacitively load the voltage source. The word line driver circuits in the plurality of word line driver circuits respectively include a driver circuit, a feedback circuit, and a load reduction circuit. The driver circuit comprises a P-channel transistor and an N-channel transistor. The P-channel transistor includes a gate terminal, a first terminal coupled to the voltage source, and a second terminal adapted for connection to a word line. The N-channel transistor includes a gate terminal, a first terminal, and a second terminal coupled to the second terminal of the P-channel transistor. In a selected mode, the word line driver circuit couples the word line to the voltage source. In a deselected mode, the word line driver circuit couples the word line to a reference potential of the first terminal of the N-channel transistor. The feedback circuit comprises a P-channel transistor. The P-channel transistor includes a gate terminal coupled to the second terminal of the N-channel transistor of the driver circuit, a first terminal coupled to the voltage source, and a second terminal coupled to the gate of the P-channel transistor of the driver circuit. The load reduction circuit comprises an N-channel transistor. The N-channel transistor includes a control terminal, a first terminal coupled to the second terminal of the P-channel transistor of the feedback circuit, and a second terminal coupled to the gate of the N-channel transistor of the driver circuit. In the deselected mode, the load reduction circuit reduces a capacitive load of the driver circuit on the voltage source.

Further, a method for lowering current consumption for the above mentioned word line driver circuit in a deselected mode according to his invention comprises the acts of:

coupling a driver circuit to a feedback circuit to pass a voltage provided by a voltage source through the feedback circuit to an input of the driver circuit in the deselected mode; and reducing a capacitive load of the driver circuit on the voltage source.

Other aspects and advantages of the present invention can be seen upon review of the figures, the detailed description, and the claims which follow.

BRIEF DESCRIPTION OF THE FIGURES

These and other features and advantages of the present invention will become more apparent to those skilled in the art from the following detailed description in conjunction with the appended drawings in which.

DETAILED DESCRIPTION

Figure 1:
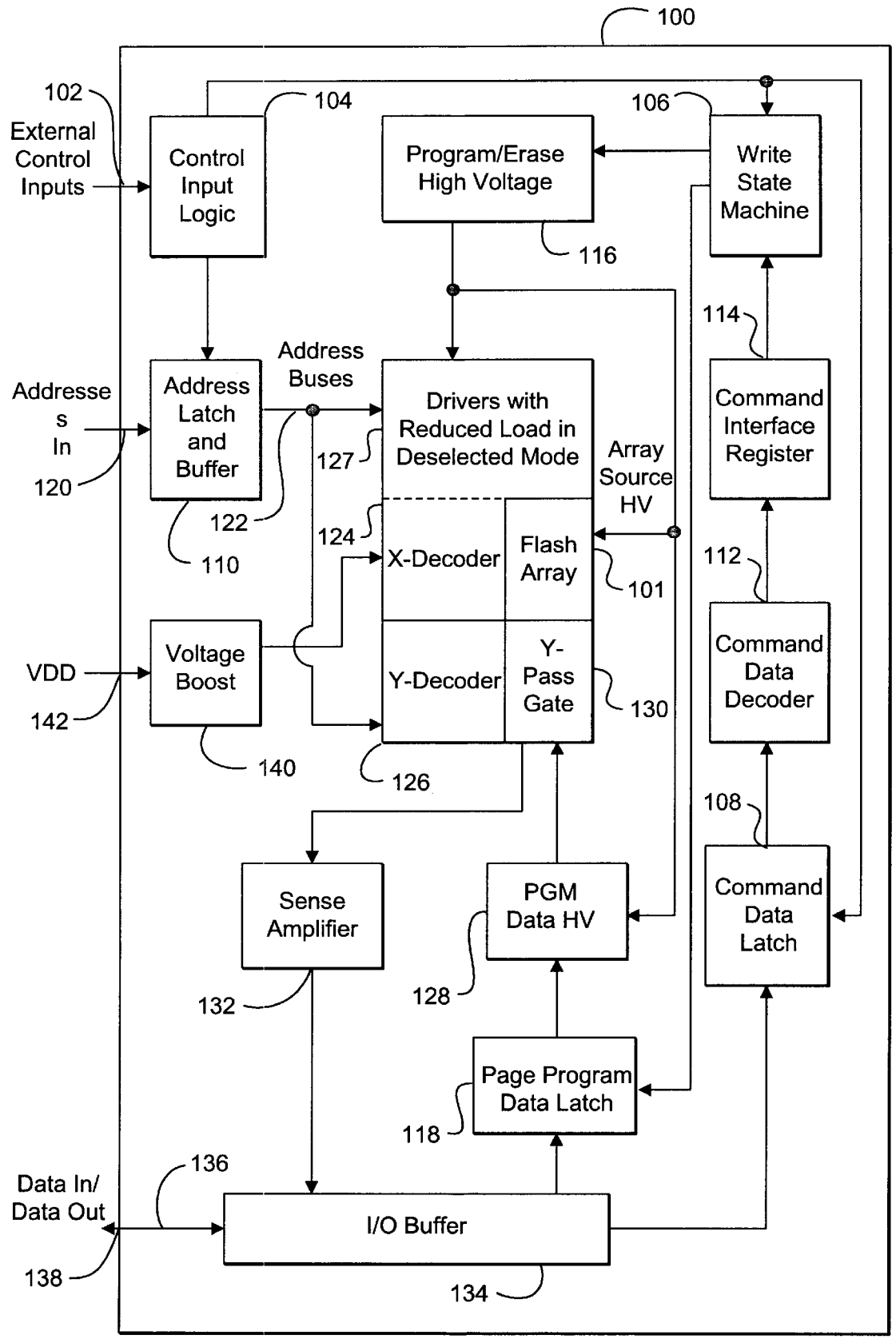
FIG. 1 is a block diagram of an integrated circuit memory device including the enhanced word line driver of the present invention.

The detailed description of the preferred embodiments of the present invention is provided with respect to FIGS. 1–7. FIG. 1 provides an overview of a flash memory device incorporating an enhanced word line driver to reduce the capacitive for low voltage applications.

FIG. 1 illustrates an integrated circuit 100 featuring a flash array 101. In other embodiments the flash array 101 may be another memory type, such as volatile memory, EPROM, FF-EEPROM, NOVRAM, or FRAM. The integrated circuit 100 includes external control inputs 102 coupled to a control input logic 104. Control input logic 104 is coupled to a write state machine 106, a command data latch 108, and an address latch and buffer 110. The command data latch 108 is coupled to a command data decoder 112. The command data decoder 112 is coupled to a command interface register 114. The command interface register 114 is coupled to the write state machine 106. The write state machine 106 is coupled to a program/erase high voltage 116 and a page program data latch 118. The page program data latch 118 accepts data from an I/O buffer 134.

The integrated circuit 100 further includes a set of address inputs 120 coupled to the address latch and buffer 110. Addresses buses 122 couple the address latch and buffer 110 to an x-decoder 124 and a y-decoder 126. The x-decoder 124 comprises drivers with reduced load in deselected mode 127. The output of the program/erase high voltage 116 is coupled to the x-decoder 124, the flash array 101, and a program data high voltage 128. The program data high voltage is coupled to the page program data latch 118 and a y-pass gate 130. The y-pass gate is coupled to a sense amplifier 132. The sense amplifier 132 is coupled to the I/O buffer 134. The I/O buffer 134 is coupled to a data bus 136 that leads off the integrated circuit via a plurality of data in/data out connections 138. The voltage boost 140, which comprises a charge pump in one embodiment, receives an off chip voltage VDD 142 and provides boosted and non-boosted voltages to the x-decoder 124. Voltage boost 140 is comprised in the x-decoder 124, and is shown separately in the heuristic FIG. 1.

The control input logic 104 is set in motion by external control inputs 102 that include, for example, write enable, output enable, write protect, and byte enable. Write state machine 106 eases the load on a microprocessor outside the integrated circuit 100 by cycling automatically through many erase or program steps. The program/erase high voltage 116 supplies the x-decoder 124, an array source high voltage to the flash array 101 for erase operations, and the program data high voltage 128 for program operations.

The page program data latch 118 implements page program mode, minimizing programming time. The I/0 buffer 134 receives data from, and sends data to, the outside of the integrated circuit via the data bus 136. The I/0 buffer sends data to be programmed to the page program data latch 118 and receives data to be sent outside the integrated circuit 100 from the sense amplifier 132. The sense amplifier 132, upon receiving data from the flash array 101 through the y-pass gate 130, improves access speeds.

The address latch and buffer 110 accepts input from the set of address inputs 120. Addresses are sent via address buses 122 to the x-decoder 124 and the y-decoder 126 to access memory cells in the flash array 101.

Figure 2:
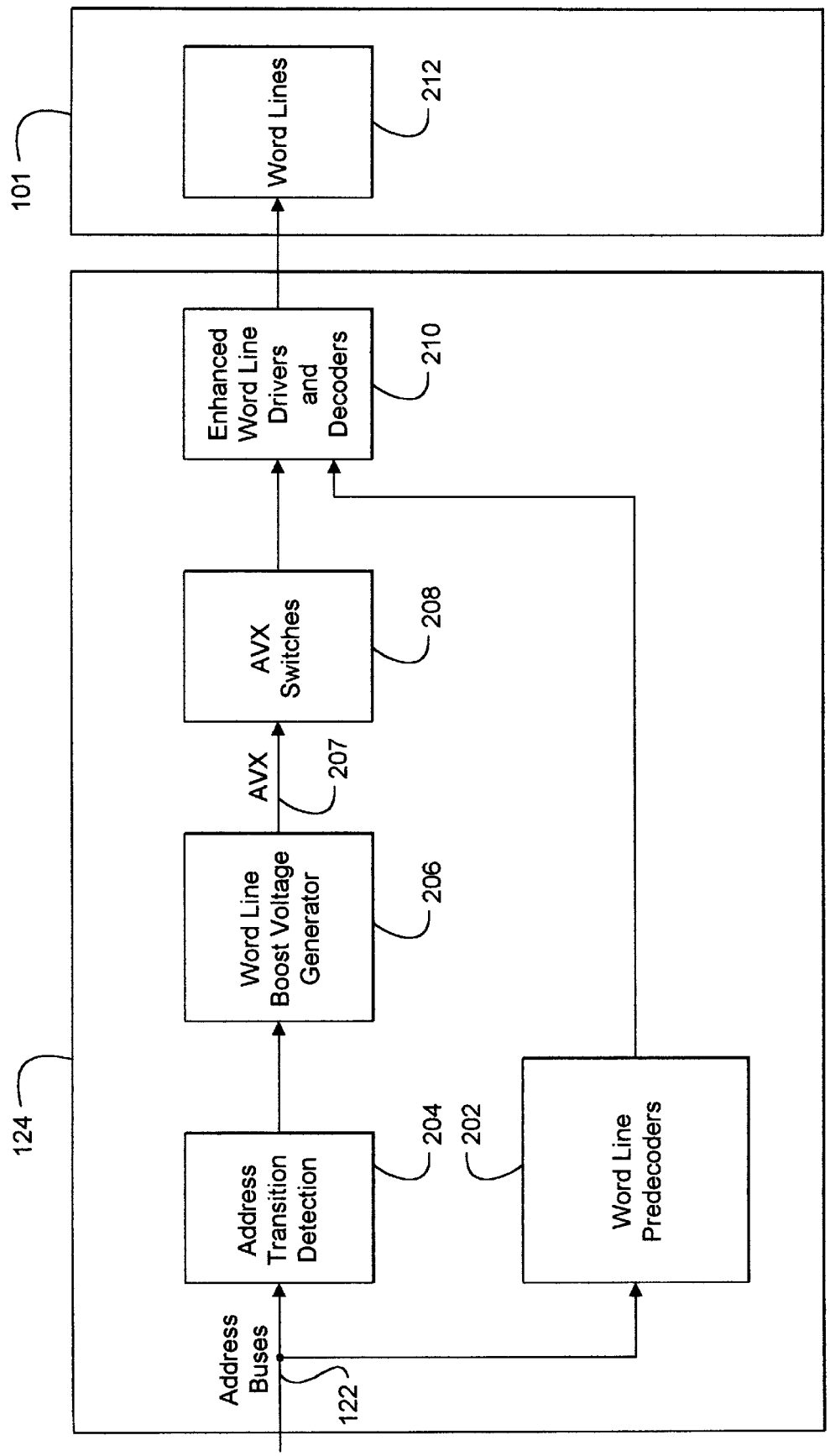
FIG. 2 is a block diagram of the x-decoder in the system of FIG. 1.

FIG. 2 shows a more detailed view of the x-decoder 124 from FIG. 1. Address buses 122 carry memory addresses to word line predecoders 202 and an address transition detection circuit 204. The address detection circuit 204 couples to a word line boost voltage generator 206. The word line boost voltage generator 206 is coupled to node 207, carrying signal AVX. Node 207 is coupled to AVX switches 208. AVX switches 208 are coupled to enhanced word line drivers and decoders 210. The enhanced word line drivers and decoders 210 are coupled to word line predecoders 202 and to word lines 212 included in the flash array 101.

Word line predecoders 202 generate signals that select a particular section within the enhanced word line drivers and decoders 210. Address transition detection 204 generates select signals that indicate transitions between word lines 212.

The word line boost voltage generator 206 adapts the integrated circuit 100 to function with a supply voltage external to the integrated circuit, over a range of about 2.7 to 3.6 volts. One embodiment of the word line boost voltage generator 206 comprises a charge pump. The external supply voltage is boosted to an on chip voltage useful for on chip operations. For example, word lines that supply a gate potential to flash memory cells are designed to operate at a read voltage of 4 volts or more. The boosted or nonboosted voltage is sent as signal AVX to AVX switches 208. AVX switches 208 in turn couple to sections of word line drivers within enhanced word line drivers and decoders 210.

Figure 3:
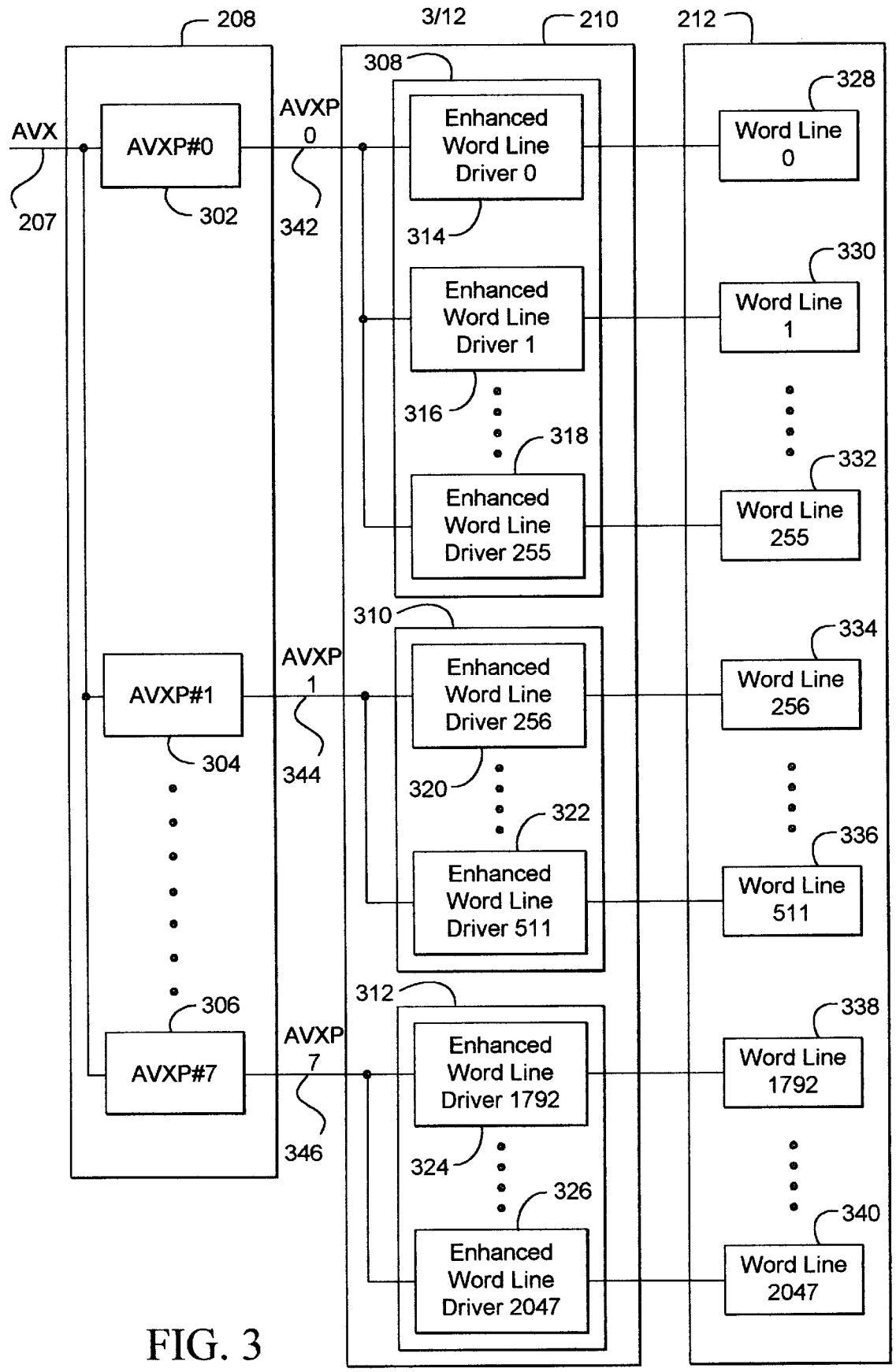
FIG. 3 is a block diagram of the AVX switches and the enhanced word line drivers and decoders in the system of FIG. 2.

FIG. 3 shows more detailed views of AVX switches 208 and enhanced word line drivers and decoders 210 from FIG. 2. Decoders within enhanced word line drivers and decoders 210 are not included in FIG. 3. AVX switches 208 comprise eight switches, AXP#0 to AVXP#7, receiving input from node 207 carrying signal AVX. Only AVXP#0 302, AVXP#1 304, and AVXP#7 306 are shown in FIG. 3. Enhanced word line drivers and decoders 210 comprise 2048 word line drivers, divided into eight sections of 256 word line drivers each. FIG. 3 shows only three of the eight sections, section 308, section 310, and section 312, each comprising 256 word line drivers. Section 308 comprises enhanced word line driver 0 to enhanced word line driver 255, for example enhanced word line driver 0, 314, enhanced word line driver 1, 316, and enhanced word line driver 255, 318. Section 310 comprises enhanced word line driver 256 to enhanced word line driver 511, for example enhanced word line driver 256, 320, and enhanced word line driver 511, 322. Section 312 comprises enhanced word line driver 1792 to enhanced word line driver 2047, for example enhanced word line driver 1792, 324, and enhanced word line driver 2047, 326. Each enhanced word line driver is coupled to one or more word lines included in word lines 212. Enhanced word line driver 0, 314 is coupled to word line 0, 328. Enhanced word line driver 1, 316 is coupled to word line 1, 330. Enhanced word line driver 255, 318, is coupled to word line 255, 332. Enhanced word line driver 256, 320, is coupled to word line 256, 334. Enhanced word line driver 511, 322, is coupled to word line 511, 336. Enhanced word line driver 1792, 324, is coupled to word line 1792, 338 Enhanced word line driver 2047, 326 is coupled to word line 2047, 340.

Node 342 between AVXP#0 302 and section 308 carries signal AVXP0. Node 344 between AVXP#1 304 and section 310 carries signal AVXP1. Node 346 between AVXP#7 and section 312 carries signal AVXP7. One of the eight switches AVXP#0 to AVXP#7 is selected, causing one of the eight 256 word line driver sections, such as one of section 308, section 310, and section 312, to load the word line boost voltage generator 206. When AVXP#0 302 is selected, section 308 with enhanced word line driver 0 to enhanced word line driver 255 loads the word line boost voltage generator 206. In the remaining discussion, AVXP#0 302 is selected and the other AVX switches, for example AVXP#1 304 and AVXP#7 306, are deselected. In the remaining discussion, enhanced word line driver 0, 314, is selected, and the remaining 2047 enhanced word line drivers, from enhanced word line driver 1, 316, to enhanced word line driver 2047, 326, are deselected.

The word line boost voltage generator 206 suffers capacitive loading from deselected word line drivers. Capacitive loading lengthens the voltage boost time and increases power consumption. When AVXP#0 302 is selected and enhanced word line driver 0, 314, is selected, 255 deselected enhanced word line drivers, including deselected enhanced word line driver 1, 316, and deselected enhanced word line driver 255, 318, capacitively load the word line boost voltage generator 206. The present invention decreases the capacitive loading of deselected word line drivers on the word line boost voltage generator 206, shortening the voltage boost time and decreasing power consumption. The shortened voltage boost time speeds read operations on the selected word line 0, 328.

Figure 4:
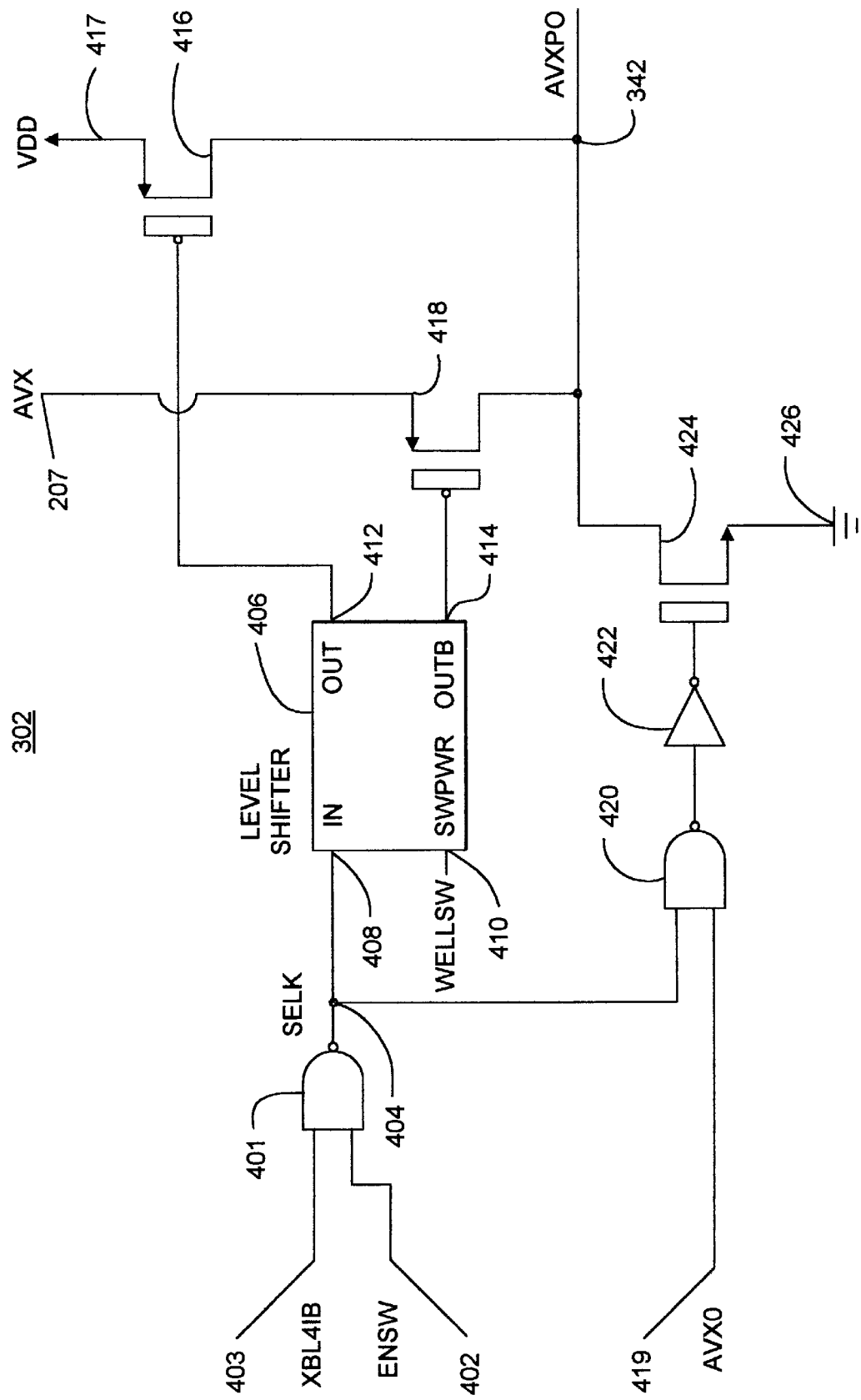
FIG. 4 is a simplified diagram of the AVX switch in the system of FIG. 3.

FIG. 4 shows a more detailed view of AVXP#0 302. Transistors having a thick gate oxide are indicated with a circuit symbol including a rectangle for the gate terminal. Transistors having a thick gate oxide are: 416, 418, and 424. NAND gate 401 has two inputs, node 402 carrying signal ENSW and node 403 carrying signal XBL4IB. Signal XBL4IB is sent from the decoder to select one of the eight wordline driver sections. ENSW is an enabling signal. NAND gate 401 is coupled to node SELK 404. Level shifter 406 has two inputs, IN 408 and SWPWR 410. Input SWPWR 410 is coupled to WELLSW, a voltage source for the level shifter 406. Input IN 408 is coupled to node SELK 404. Level shifter 406 has two outputs, OUT 412 and OUTB 414. P-channel transistor 416 has a gate coupled to OUT 412, a source coupled to supply voltage VDD 417, and a drain coupled to node 342. P-channel transistor 418 has a gate coupled to OUTB 414, a source coupled to node 207 carrying signal AVX, and a drain coupled to node 342. The two inputs to NAND gate 420 are node SELK 404 and node 419 carrying signal AVX0, a signal allowing node 342 to discharge to ground 426. NAND gate 420 is coupled to inverter 422. N-channel transistor 424 has a gate coupled to inverter 422, a source coupled to ground 426, and a drain connected to node 342. The output of AVXP#0 302 is signal AVXP0 on node 342. AVXP#0 302 couples and decouples the word line boost voltage generator 206 to section 308. Consequently, AVXP#0 302 couples and decouples the word line boost voltage generator 206 to the parasitic capacitances of section 308.

When level shifter 406 input IN 408 is low, OUT 412 outputs low and OUTB 414 outputs the signal on SWPWR 410. When level shifter 406 input IN 408 is high, OUT 412 outputs the signal on SWPWR 410 and OUTB 414 outputs low.

Figure 5A:
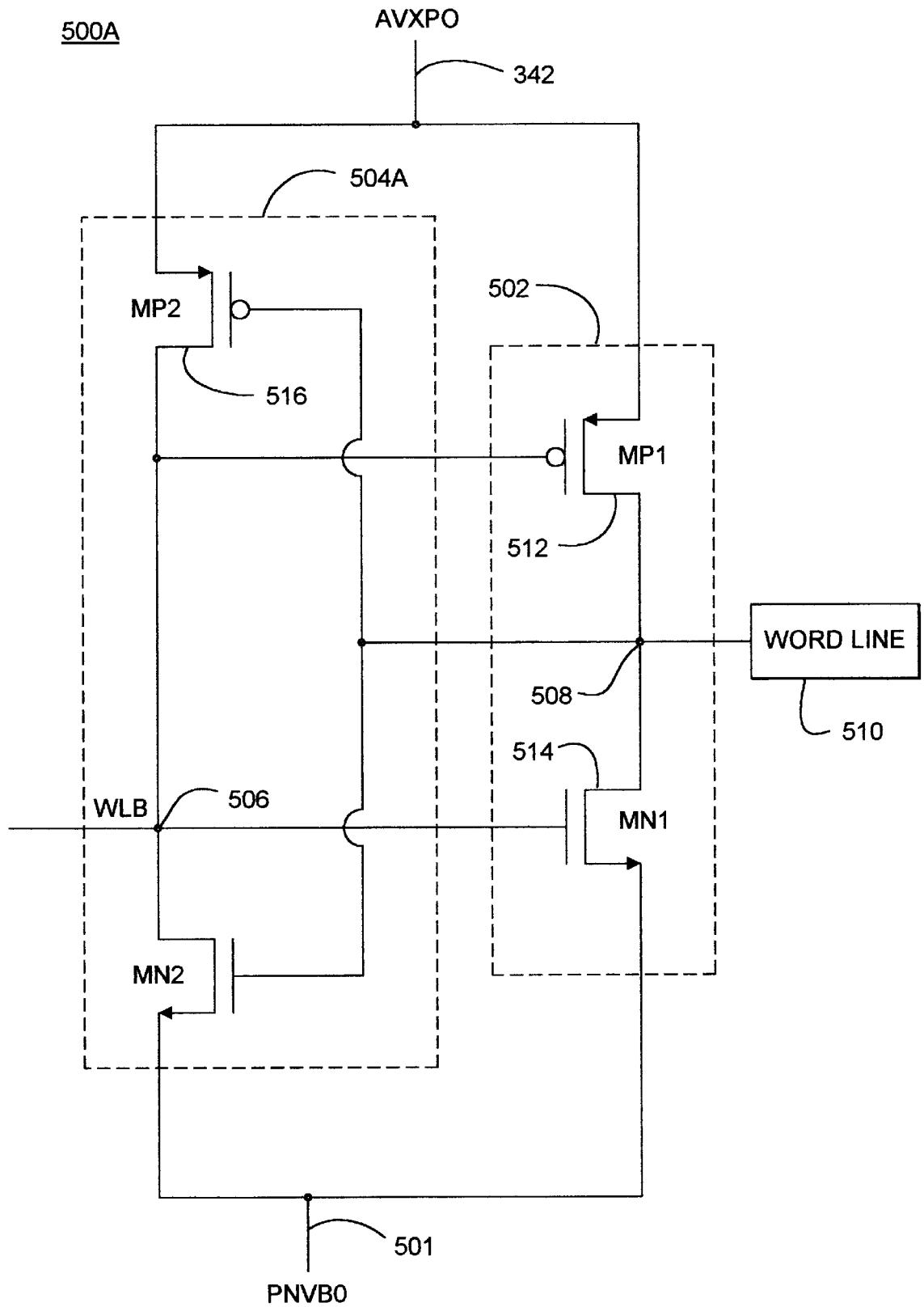
FIGS. 5A and 5B illustrate prior art word line drivers.
Figure 5B:
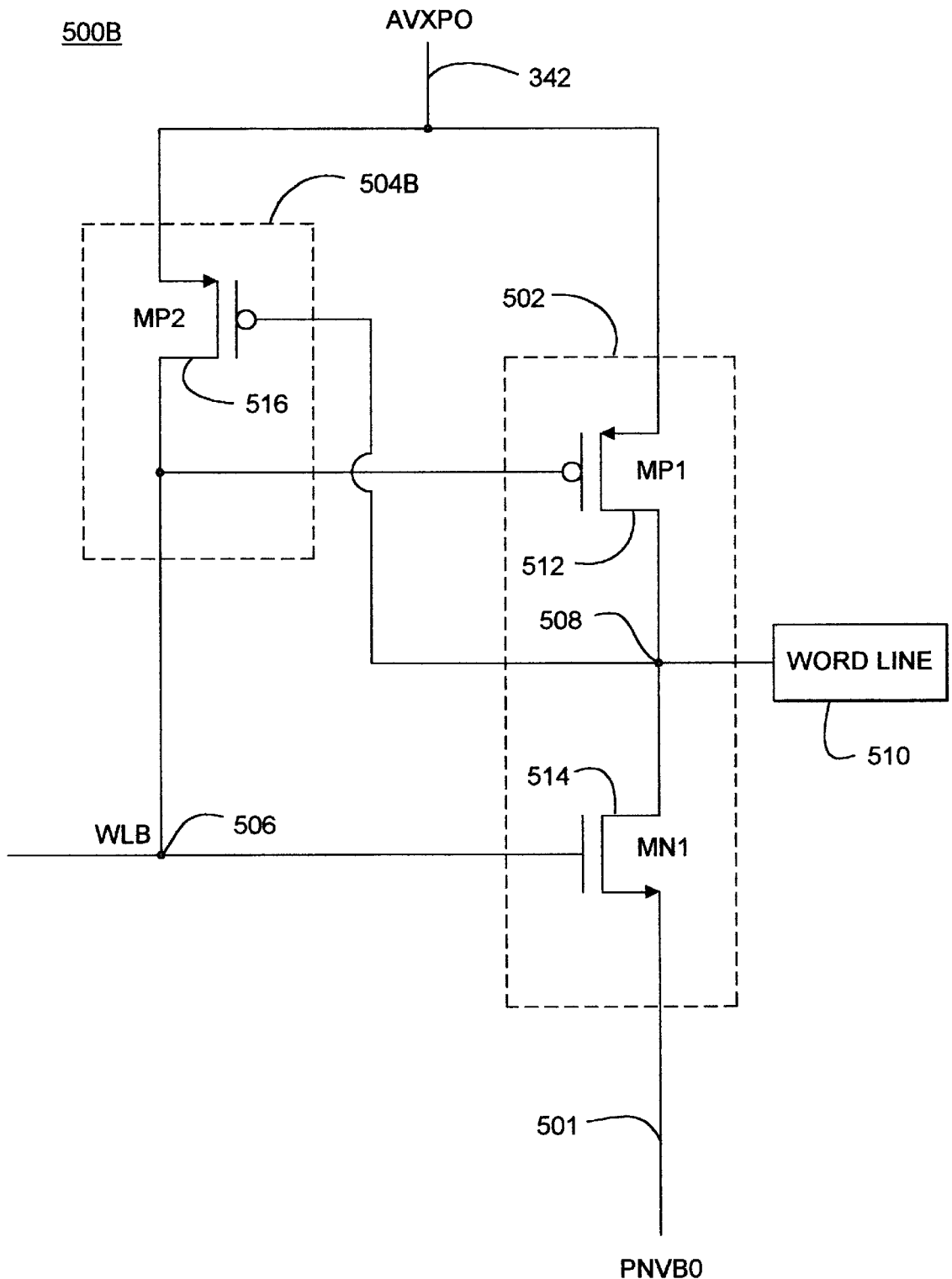

FIG. 5A shows prior art word line driver 500A, comprising a driver circuit 502 and a feedback circuit 504A. Node 342 supplies signal AVXP0. Node 501 supplies signal PNVB0. Node WLB 506 is an input to the driver circuit 502 and an output of the feedback circuit 504A. Node 508 is an input to the feedback circuit 504A and an output of the driver circuit 502. Node 508 leads to a word line 510. The driver circuit 502 comprises P-channel transistor MP1 512 and N-channel transistor MN1 514, each having a gate, a source, and a drain. The gates of P-channel transistor MP1 512 and N-channel transistor MN1 514 are coupled to node WLB 506. The drains of P-channel transistor MP1 512 and N-channel transistor MN1 514 are coupled to node 508. The source of P-channel transistor MP1 512 is coupled to node 342. The source of N-channel transistor MN1 514 is coupled to node 501. The feedback circuit 504A comprises P-channel transistor MP2 516 and N-channel transistor MN2 518, each having a gate, a source, and a drain. The gates of P-channel transistor MP2 516 and N-channel transistor MN2 518 are coupled to node 508. The drains of P-channel transistor 516 and N-channel transistor MN2 518 are coupled to node WLB 506. The source of P-channel transistor MP2 516 is coupled to node 342. The source of N-channel transistor MN2 518 is coupled to node 501.

Node WLB 506 controls whether the word line driver 500A and the word line 510 are selected or deselected. The operation of the word line driver 500A comprising driver circuit 502 and feedback circuit 504A is well known to those skilled in the art. When node WLB 506 is low, the word line driver 500A is in selected mode and the word line 510 is coupled to node 342 providing signal AVXP0; word line 510 is selected. When node WLB 506 is high, the word line driver 500A is in deselected mode and the word line 510 is coupled to node 501 providing signal PNVB0; the word line 510 is deselected.

When word line driver 500A is in deselected mode and word line 510 is deselected, driver circuit 502 couples node 508 to node 501 through N-channel transistor MN1 514, and feedback circuit 504A couples node 342 to the gates of P-channel transistor MP1 512 and N-channel transistor MN1 514 through P-channel transistor MP2 516. Thus, when prior art word line driver 500A is in deselected mode, node 342 carrying signal AVXP0 is coupled to the gate capacitance of N-channel transistor MN1 514. Thus, node 342 is loaded with the gate capacitance of N-channel transistor MN1 514. Node 342 is also loaded with the capacitance of P-channel transistor MP1 512, which in deselected mode includes an overlap capacitance smaller than the gate capacitance of N-channel transistor MN1 514. When the word line boost voltage generator 206 outputs the signal AVX on node 207, the voltage of the gate of transistor MN1 514 reaches a corresponding voltage. For example, if signal AVX on node 207 provides some nonboosted voltage in the range of about 2.7 to 3.6 volts, in deselected word line driver 500A the voltage of the gate of transistor MN1 514 rises to a comparable nonboosted voltage in the range of about 2.7 to 3.6 volts. In another example, if signal AVX on node 207 provides some boosted voltage of 4 volts or more in preparation for a read operation to access flash array 101, in deselected word line driver 500A the voltage of the gate of transistor MN1 514 rises to a comparable boosted voltage of 4 volts or more. Because 255 deselected word line drivers are coupled to node 342, the gate capacitance of N-channel transistor MN1 514 in each deselected word line driver cumulatively contributes to significantly increased power consumption and lengthened voltage boost times. In normal operation, there are many deselected word line drivers and only one selected word line driver.

FIG. 500B shows a prior art word line driver 500B. Prior art word line driver 500B is structurally similar to prior art word line driver 500A except for a feedback circuit 504B, which does not include N-channel transistor MN2 518. The operation of prior art word line driver 500B, comprising driver circuit 502 and feedback circuit 504B, is well known to those skilled in the art. Word line driver 500B suffers the same capacitive loading problems as the word line driver 500A.

FIGS. 6A, 6B, 6C, and 6D show various embodiments of the present invention. The enhanced word line drivers 600A, 600B, 600C, and 600D are some of the possible embodiments of, for example, enhanced word line driver 1, 316, and enhanced word line driver 255, 318. FIGS. 6A, 6B, 6C, and 6D indicate transistors having a thick gate oxide with a circuit symbol including a rectangle for the gate terminal. Transistors having a thick gate oxide are: 612, 614, 616, 618, 622, 628, 630, and 632. N-channel transistors having a lower threshold voltage due to masking during implantation of extra p-type impurities are indicated with a circuit symbol including a hatched area. Transistors having a lower threshold voltage are: 622, 628, 630, and 632. N-channel transistors having a triple well structure are indicated with a circled circuit symbol. Transistors having a triple well structure are: 614, 618, 622, and 628.

Figure 6A:
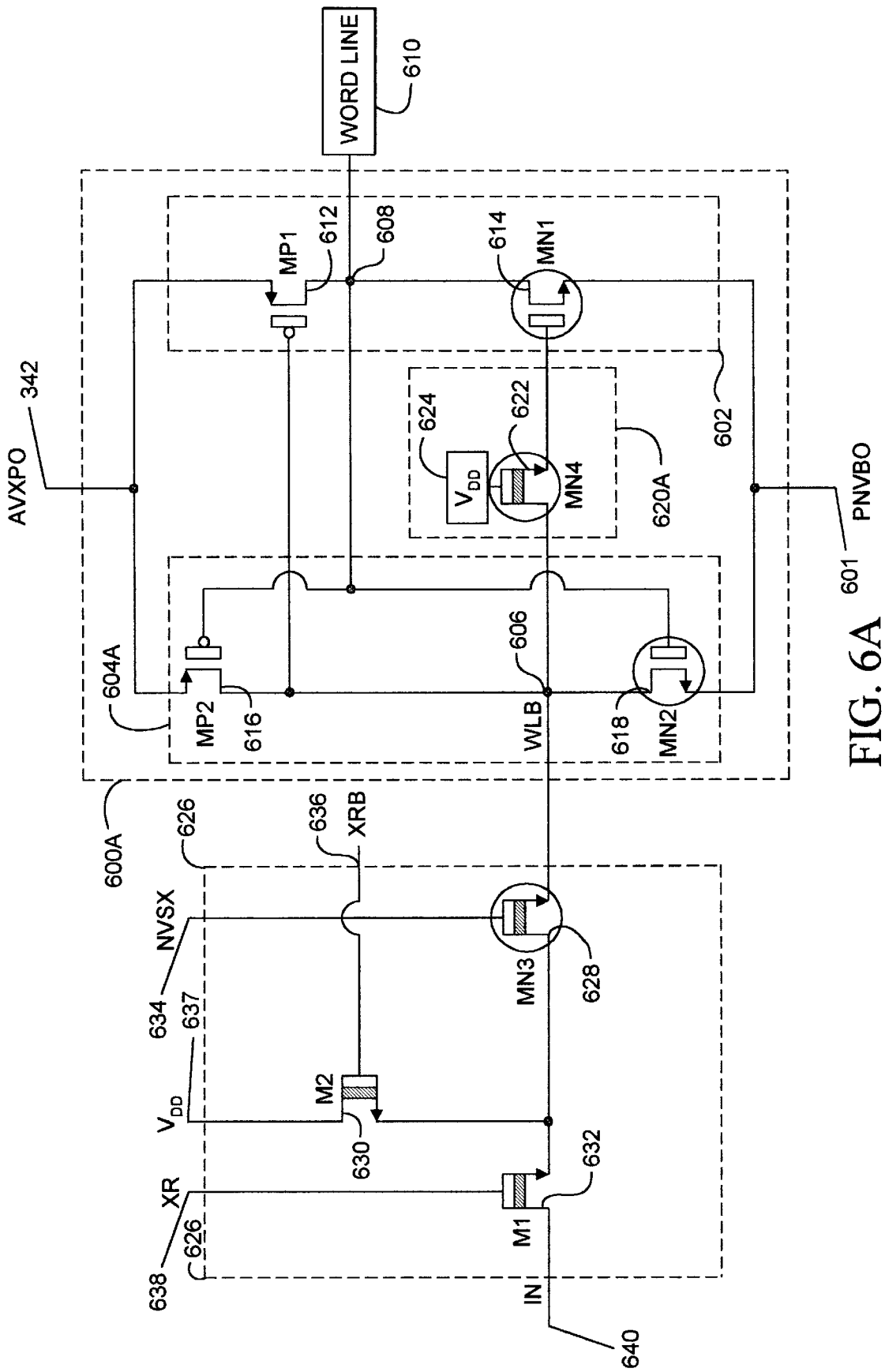
FIGS. 6A, 6B, 6C and 6D illustrate implementations of the enhanced word line driver in the system of FIG. 3.

FIG. 6A shows enhanced word line driver 600A, comprising a driver circuit 602, a feedback circuit 604A, and a load reduction circuit 620A. Node 342 supplies signal AVXP0. Node 601 supplies signal PNVB0. Node WLB 606 is an output of the feedback circuit 604A. Node 608 is an input to the feedback circuit 604A and an output of the driver circuit 602. Node 608 is coupled to a word line 610. The driver circuit 602 comprises P-channel transistor MP1 612 (w=36 μm,l=0.75 μm) and N-channel transistor MN1 614 (w=63 μm,l=0.8 μm), each having a gate, a source, and a drain. The gates of P-channel transistor MP1 612 and N-channel transistor MN1 614 are coupled to node WLB 606. The drains of P-channel transistor MP1 612 and N-channel transistor MN1 614 are coupled to node 608. The source of P-channel transistor MP1 612 is coupled to node 342. The source of N-channel transistor MN1 614 is coupled to node 601. The feedback circuit 604A comprises P-channel transistor MP2 616 (w=2.0 μm,=1.5 μm) and N-channel transistor MN2 618 (=3.35 μm, l=2.1 μm), each having a gate, a source, and a drain. The gates of P-channel transistor MP2 616 and N-channel transistor MN2 618 are coupled to node 608. The drains of P-channel transistor 616 and N-channel transistor MN2 618 are coupled to node WLB 606. The source of P-channel transistor MP2 616 is coupled to node 342. The source of N-channel transistor MN2 618 is coupled to node 601.

The input of word line driver 600A is coupled to decoder circuitry 626. The decoder circuitry 626 comprises N-channel transistors 628, 630, and 632. N-channel transistor MN3 628 (w=15.5 μm,=1.1 μm) comprises a gate coupled to node 634 carrying signal NVSX, a source coupled to node 606, and a drain. N-channel transistor M2 630 (w=12 μm,l=1.3 μm) comprises a gate coupled to node 636 carrying signal XRB, a drain coupled to node 637 providing a voltage VDD, and a source coupled to the drain of N-channel transistor MN3 628. N-channel transistor M1 632 (w=24 μm,=1.1 μm) comprises a gate coupled to node 638 carrying signal XR, a drain coupled to node 640 carrying signal IN, and a source coupled to the drain of N-channel transistor MN3 628. VDD is typically the same voltage as the off chip supply voltage. Signal NVSX is sent from the voltage selector circuitry, not shown, and signals IN, XR, and XRB are sent from the decoder, not shown.

In this preferred embodiment, the load reduction circuit 620A comprises a voltage source 624 providing a voltage VDD, and an N-channel transistor MN4 622 (w=15.5 μm,l= 1.1 μm) including a gate coupled to the voltage source 624, a drain coupled to node WLB 606, and a source coupled to the gate of transistor MN1 614. VDD is typically the same voltage as the off chip supply voltage.

Node WLB 606 controls whether the word line driver 600A and the word line 610 are selected or deselected. When node WLB 606 is low, the word line driver 600A is in selected mode and the word line 610 is coupled to node 342 providing signal AVXP0; word line 610 is selected. Signal AVXP0 has a boosted voltage or a nonboosted voltage, depending on the output of word line boost voltage generator 206. When node WLB 606 is high, the word line driver 600A is in deselected mode and the word line 610 is coupled to node 601 providing signal PNVB0; the word line 610 is deselected.

When word line driver 600A is in deselected mode and word line 610 is deselected, driver circuit 602 couples node 608 to node 601 through N-channel transistor MN1 614, and feedback circuit 604A couples node 342 to the gate of P-channel transistor MP1 612 and to node WLB 606 through P-channel transistor MP2 616. Thus, when word line driver 600A is in deselected mode, node 342 carrying signal AVXP0 is coupled to node WLB 606. Node 342 is coupled through load reduction circuit 620A to the gate of N-channel transistor MN1 614. Node 342 is loaded with the capacitance of P-channel transistor MP1 612, which in deselected mode is an overlap capacitance smaller than the gate capacitance of N-channel transistor MN1 614.

Prior to selection of one of the eight 256 word line driver sections, such as section 308, signal AVXP0 342 is set to the voltage VDD. The voltage boost circuitry will not be activated until the decoding circuitry 626 has completed decoding operations and the selected word line, such as word line 328, has reached a certain voltage level, for example the voltage VDD or a voltage a little less than VDD. Thus, prior to the voltage boost operation, the source of N-channel transistor MN4 622, coupled to the gate of N-channel transistor MN1 614, reaches a voltage level equal to the voltage VDD minus a threshold voltage of N-channel transistor MN4 622. By delaying the activation of the voltage boost circuitry, none of the boost energy will be wasted during word line transitions.

When the enhanced word line driver 600A is in deselected mode, the relationship between the voltage of signal AVX carried voltage VDD prod the voltage VDD provided by voltage source 624 determines the degree to which the load reduction circuit 620A couples or decouples the capacitance. When a gate to source voltage of N-channel transistor MN4 622 exceeds the threshold voltage of N-channel transistor MN4 622, load reduction circuit 620A fully couples the gate capacitance of N-channel transistor MN1 614 to node WLB 606. Once the voltage boost operation starts, the voltage at the gate of N-channel transistor MN1 614 stays at the voltage level equal to the voltage VDD minus the threshold voltage of N-channel transistor MN4 622, and the gate capacitance of N-channel transistor MN1 614 is decoupled from the word line boost voltage generator 206.

In the preferred embodiment, a magnitude of the threshold voltage is minimized in order to effectively turn on N-channel transistor MN1 614 when the word line driver is in a deselected state. Thus, the threshold voltage of N-channel transistor MN4 622 is less than the typical threshold of other transistors in the word line driver circuit, for example, N-channel transistor MN1 614. The threshold voltage of transistor MN4 622 in this example is about 0.3 volts. The threshold voltage of transistor MN1 614 is about 0.6 volts in this example. The threshold voltage can be adjusted by, for example, ion implantation into the channel region of a transistor.

For example, in one embodiment the threshold voltage of transistor MN4 622 is about 0.3 volts, the voltage source 624 provides a voltage VDD in a range of about 2.7 to 3.6 volts, for example 2.8 volts, and signal AVXP0 provides one of a nonboosted voltage of 2.8 volts and a boosted voltage of about 4.0 volts, a voltage necessary for a read operation. VDD is typically the same voltage as the off chip supply voltage. When deselected word line driver 600A receives signal AVXP0 that provides the nonboosted voltage of 2.8 volts, the load reduction circuit 620A couples signal AVXP0 to the gate of N-channel transistor MN1 614 and the gate of transistor MN1 614 rises to about 2.5 volts, sufficient to effectively turn on N-channel transistor MN1 614. When deselected word line driver 600A then receives a signal AVXP0 that provides the boosted voltage of about 4.0 volts, the voltage at the gate of transistor MN1 614 remains at about 2.5 volts. The load reduction circuit 620A decouples the signal AVX from the gate capacitance of transistor MN1 614. For simplicity of explanation, the above example does not take into account the body effect of N-channel transistor MN1 622, so the 2.5 volt figure is actually too high.

Figure 6B:
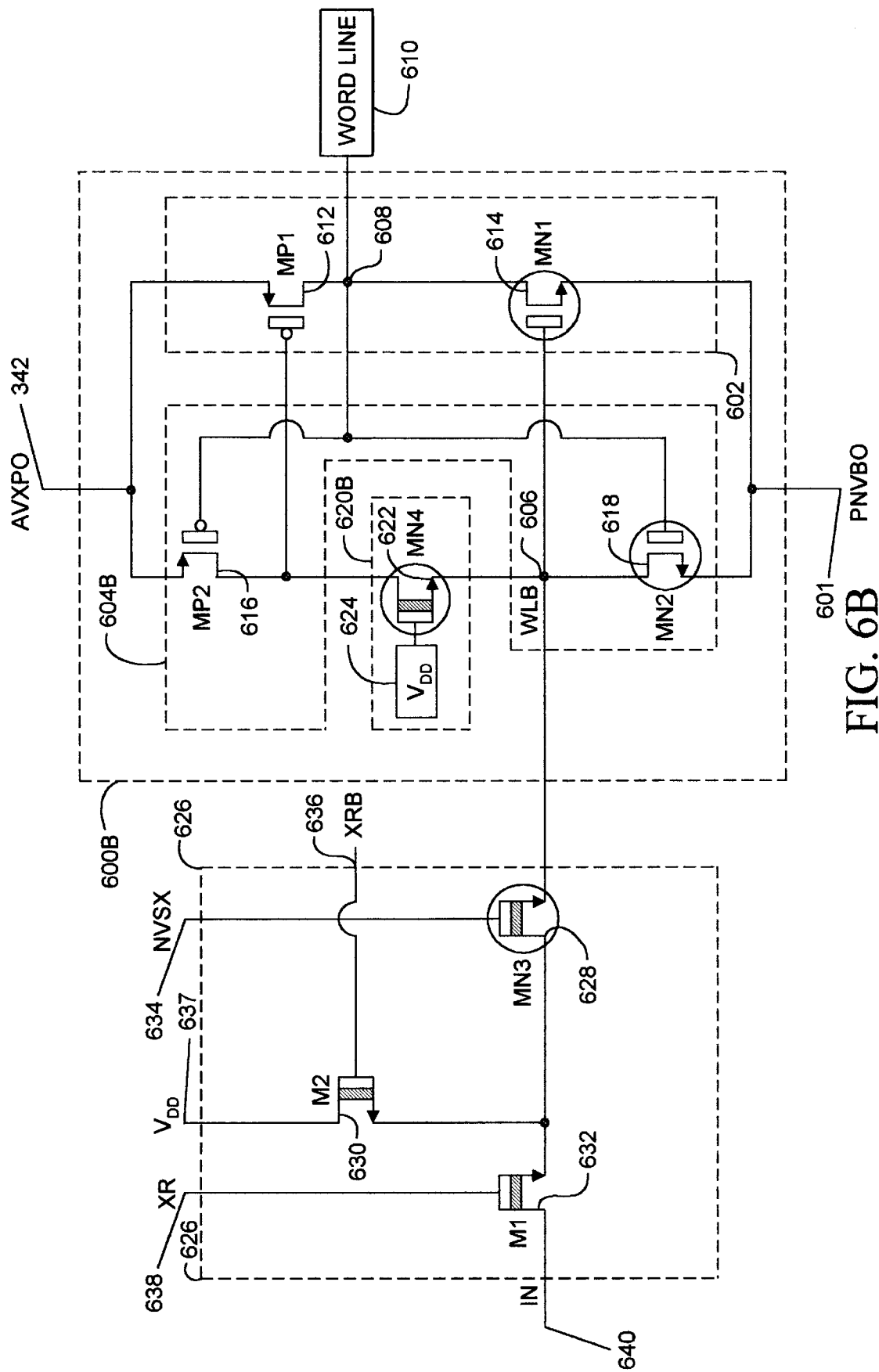

FIG. 6B shows another embodiment of the present invention, showing enhanced word line driver 600B. Enhanced word line driver 600B is similar to enhanced word line driver 600A, but comprises a load reduction circuit 620B and feedback circuit 604B. Load reduction circuit 620B comprises an N-channel transistor 622, including a gate coupled to voltage source 624, a source coupled to node WLB 606, and a drain coupled to the drain of P-channel transistor MP2 616. The channel width and length dimensions for transistors in FIG. 6B are similar to the dimensions given in the discussion of FIG. 6A above, except for transistors 622 (w=24 $\mu$m, l=1.1 $\mu$m) and 628 (w=24 $\mu$m, l=1.1 $\mu$m).

Figure 6C:
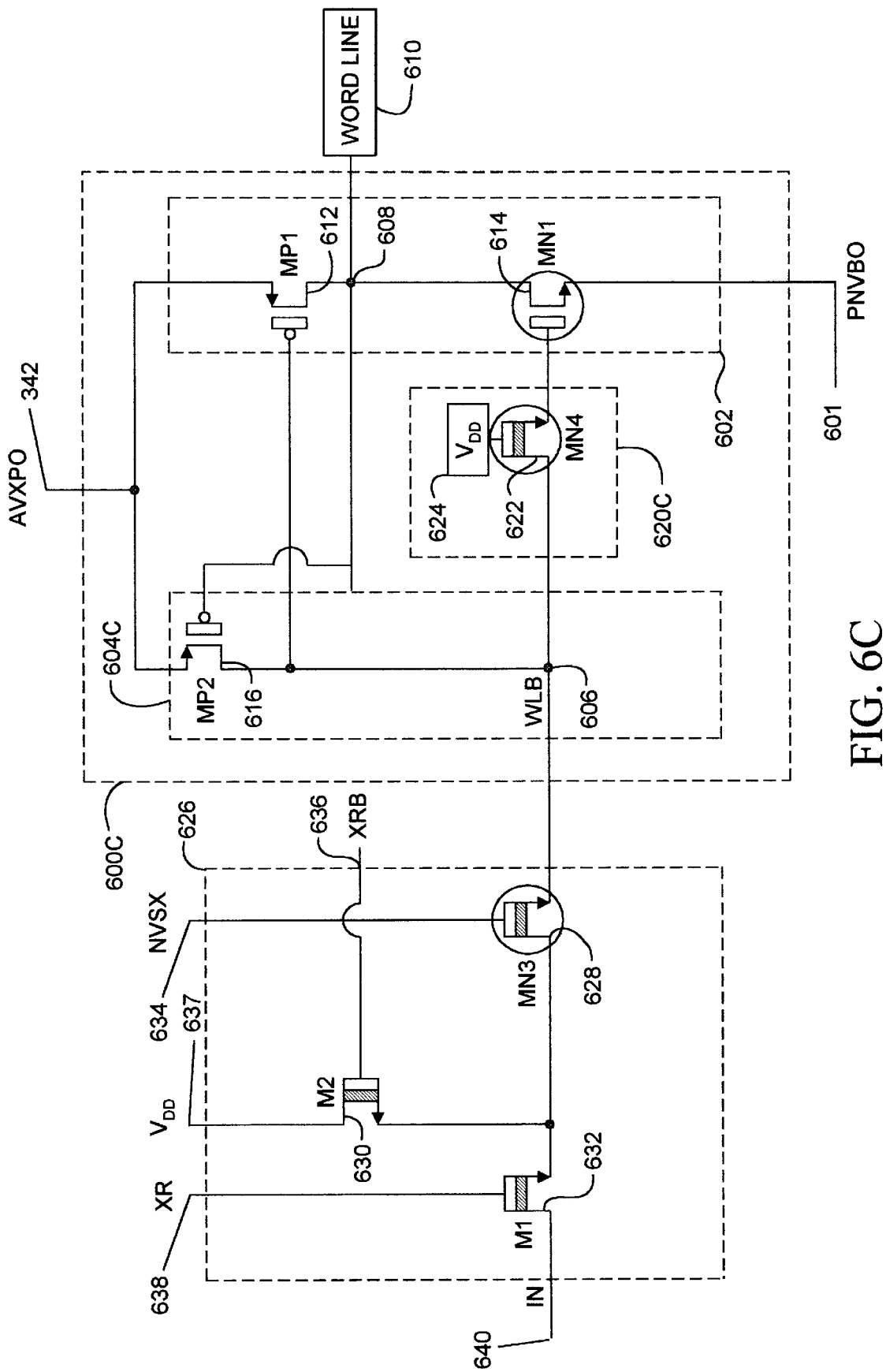

FIG. 6C shows another embodiment of the present invention, showing enhanced word line driver 600C. Enhanced word line driver 600C is similar to enhanced word line driver 600A, but lacks N-channel transistor MN2 618.

Figure 6D:
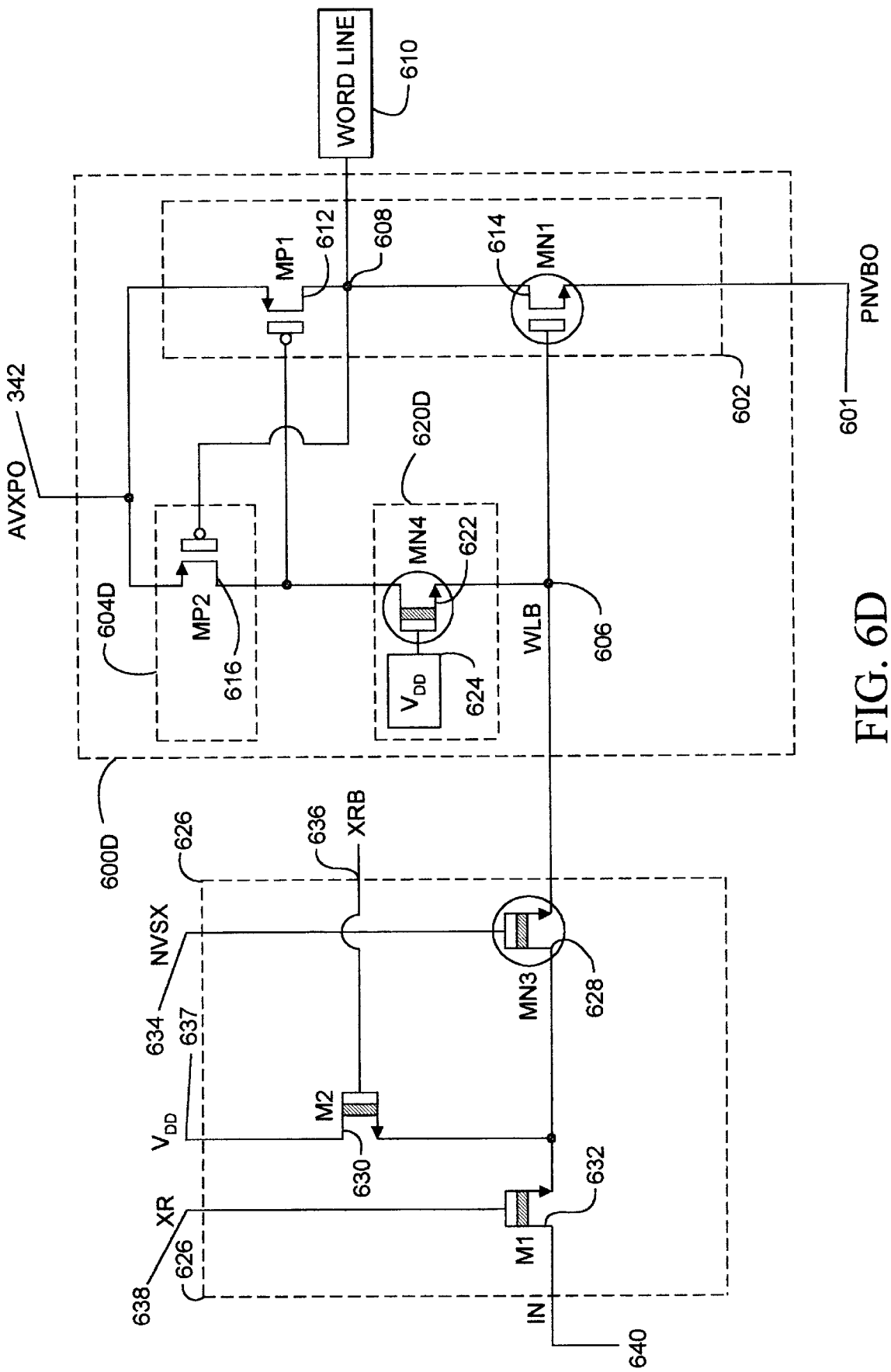

FIG. 6D shows another embodiment of the present invention, showing enhanced word line driver 600D. Enhanced word line driver 600D is similar to enhanced word line driver 600B, but lacks N-channel transistor MN2 618.

In another embodiment, signal AVX may be decoupled from the gate capacitance of transistor MN1 614 in connection with another operation, such as erase or program.

In another embodiment, an enhanced word line driver comprises a load reduction circuit which allows part of the VDD energy to precharge the gate of N-channel transistor MN1 614 before the voltage boosting operation, so that N-channel transistor MN1 614 is on, signal PNVB0 is coupled to the word line 610 in a deselected state, and the circuitry does not need to charge the gate capacitance during the following voltage boost.

Other possible embodiments of the present invention include but are not limited to an enhanced word line driver that couples a word line to a negative voltage for read operations, an enhanced word line driver comprising a load reduction circuit including a P-channel transistor, and other reconfigurations obvious to those skilled in the art.

Figure 7A:
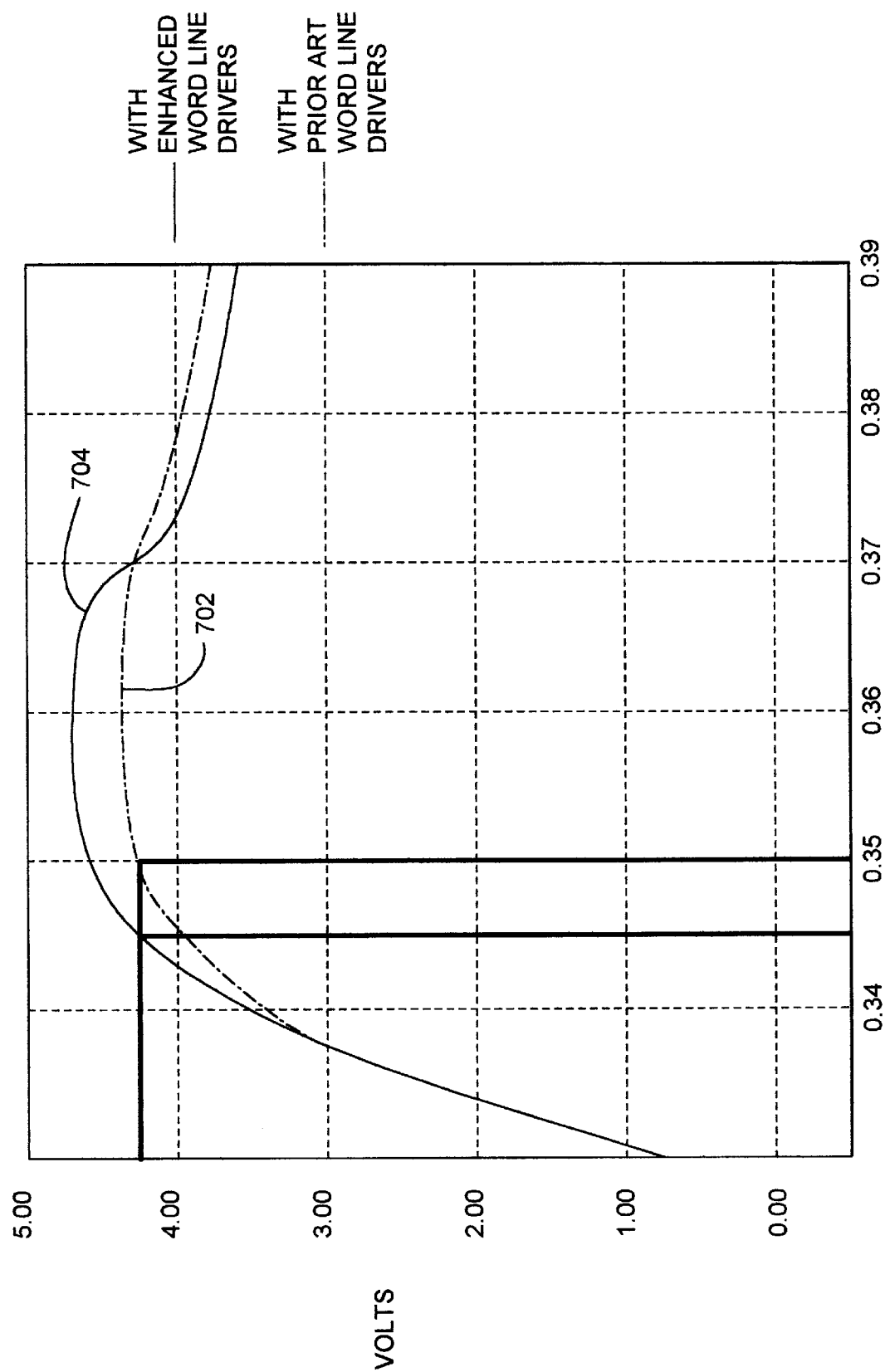
FIGS. 7A and 7B are graphs illustrating improvements in an integrated circuit memory device resulting from implementing the enhanced word line driver.
Figure 7B:
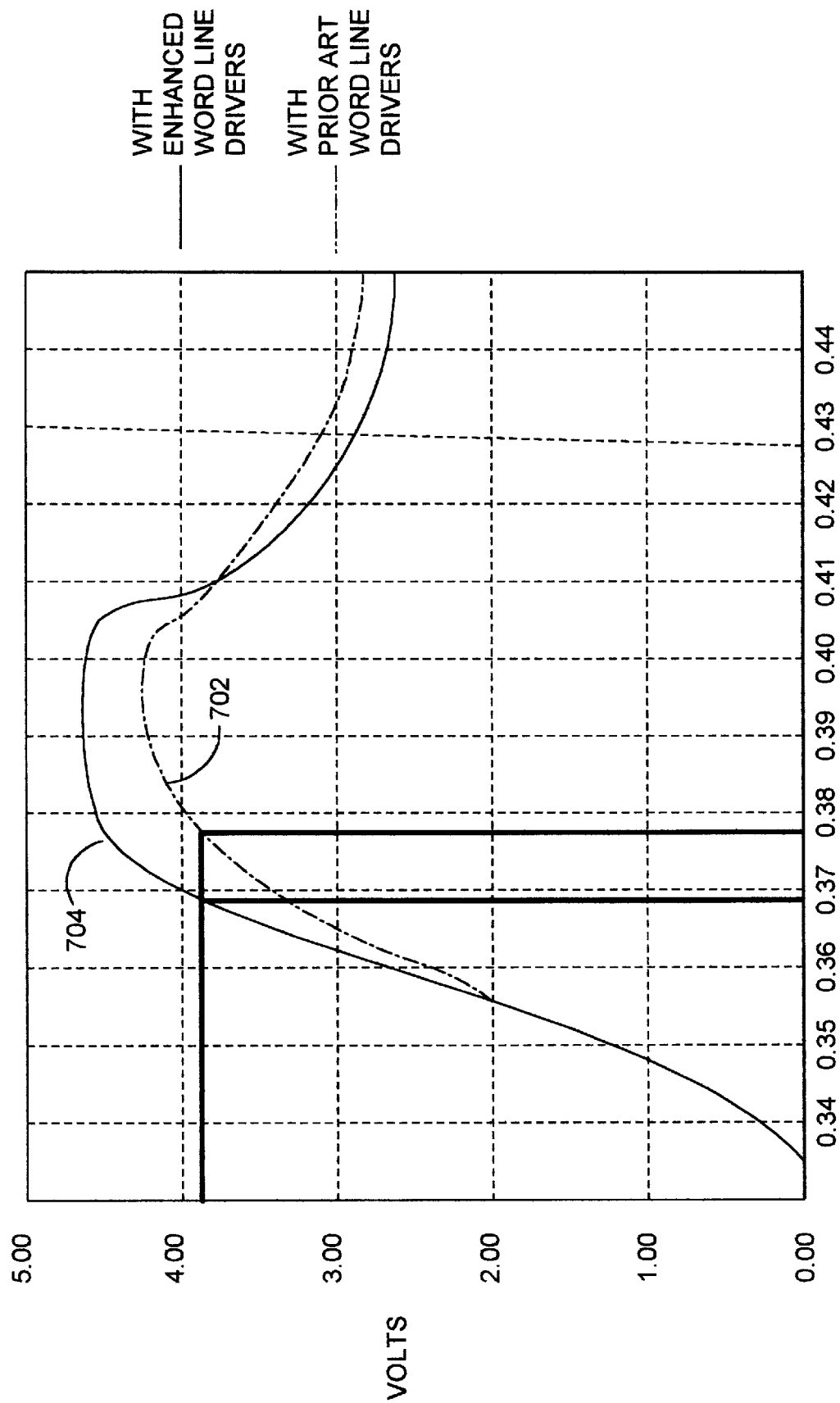

FIGS. 7A and 7B show word line timing waveforms in response to selected decoding signals and compare operation of an integrated circuit memory device with and without the present invention. Waveform 702 indicates output of a prior art selected word line driver. Waveform 704 indicates output of a selected enhanced word line driver, for example enhanced word line driver 0 314. Waveform 704 rises faster as a result of less capacitive loading from deselected word line drivers. FIG. 7A shows timing waveforms for an integrated circuit memory device with a nonboosted voltage of 3.7 volts at a temperature of −40 degrees C. In FIG. 7A, the selected word line driver provides a read mode voltage with a speed enhancement of about 5 nanoseconds. FIG. 7B shows timing waveforms for an integrated circuit memory device with a nonboosted voltage of 2.6 volts at a temperature of 85 degrees C. In FIG. 7B, the selected word line driver provides a read mode voltage with a speed enhancement of about 9 nanoseconds. The lower the nonboosted voltage, the more improvement the enhanced word line driver will make.

The foregoing description of preferred embodiments of the invention has been presented for the purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A word line driver circuit comprising:
  a voltage source supplying a first voltage;
  a driver circuit including an input, a first power input, a second power input, and an output, and the output coupled to a word line, and the first power input coupled to the voltage source, and the word line driver circuit in a selected mode coupling the word line to the first power input, and the word line driver circuit in a deselected mode coupling the word line to the second power input;
  a feedback circuit including an input, an output, and a power input, and the input of the feedback circuit coupled to the output of the driver circuit, and the power input of the feedback circuit coupled to the voltage source; and
  a load reduction circuit, including an input, an output, and a control input, and the input of the load reduction circuit coupled to the output of the feedback circuit, and the output of the load reduction circuit coupled to the input of the driver circuit, and in the deselected mode the load reduction circuit reducing a capacitive load of the driver circuit on the voltage source.

2. The word line driver circuit of claim 1, wherein the load reduction circuit comprises a transistor including a control terminal, a first terminal, and a second terminal, and the control terminal coupled to the control input of the load reduction circuit, and the first terminal coupled to the input of the load reduction circuit, and the second terminal coupled to the output of the load reduction circuit.

3. The word line driver circuit of claim 2, wherein the driver circuit includes a transistor, and the transistor of the driver circuit has a threshold voltage, and the transistor of the load reduction circuit includes a threshold voltage, and the threshold voltage of the transistor of the load reduction circuit has a magnitude less than a magnitude of the threshold voltage of the transistor device included in the driver circuit.

4. The word line driver circuit of claim 1, wherein the control input of the load reduction circuit is coupled to a second voltage source, and the second voltage source providing a second voltage.

5. The word line driver circuit of claim 4, wherein the second voltage has a magnitude less than a magnitude of the first voltage.

6. The word line driver circuit of claim 1, wherein the driver circuit comprises an inverter.

7. The word line driver circuit of claim 1, wherein the feedback circuit comprises a transistor.

8. The word line driver circuit of claim 1, wherein the feedback circuit comprises an inverter.

9. The word line driver circuit of claim 1, wherein the first voltage is for a read operation.

10. The word line driver circuit of claim 1, wherein the voltage source comprises a charge pump.

11. A word line driver circuit comprising:
  a voltage source;
  a driver circuit comprising:
    a P-channel transistor including a gate terminal, a first terminal coupled to the voltage source, and a second terminal adapted for connection to a word line; and
    an N-channel transistor including a gate terminal, a first terminal, and a second terminal coupled to the second terminal of the P-channel transistor,
    wherein the word line driver circuit in a selected mode couples the word line to the voltage source, and the word line driver circuit in a deselected mode couples the word line to a reference potential of the first terminal of the N-channel transistor;
  a feedback circuit comprising:
    a P-channel transistor including a gate terminal coupled to the second terminal of the N-channel transistor of the driver circuit, a first terminal coupled to the voltage source, and a second terminal coupled to the gate of the P-channel transistor of the driver circuit; and
  a load reduction circuit comprising:
    an N-channel transistor including a control terminal, a first terminal coupled to the second terminal of the P-channel transistor of the feedback circuit, and a second terminal coupled to the gate of the N-channel transistor of the driver circuit,
    wherein in the deselected mode the load reduction circuit reduces a capacitive load of the driver circuit on the voltage source.

12. The word line driver circuit of claim 11, wherein the feedback circuit further comprises:
  an N-channel transistor including a gate terminal coupled to the second terminal of the N-channel transistor of the driver circuit, a first terminal coupled to the reference potential, and a second terminal coupled to the gate of the P-channel transistor of the driver circuit.

13. An integrated circuit memory device, comprising:
  a memory array, including a plurality of word lines coupled to memory cells in the array;
  a plurality of address inputs adapted to receive addresses identifying selected memory cells in the array;
  a voltage source supplying a first voltage;
  a plurality of word line driver circuits, and the plurality of word line driver circuits capacitively loading the voltage source, and one or more word line driver circuits in the plurality of word line driver circuits comprising:
    a driver circuit including an input, a first power input, a second power input, and an output, and the output coupled to a word line, and the first power input coupled to the voltage source, and the word line driver circuit in a selected mode coupling the word line to the first power input, and the word line driver circuit in a deselected mode coupling the word line to the second power input;
    a feedback circuit including an input, an output, and a power input, and the input of the feedback circuit coupled to the output of the driver circuit, and the power input of the feedback circuit coupled to the voltage source; and a load reduction circuit, including an input, an output, and a control input, and the input of the load reduction circuit coupled to the output of the feedback circuit, and the output of the load reduction circuit coupled to the input of the driver circuit, and in the deselected mode the load reduction circuit reducing a capacitive load of the driver circuit on the voltage source; and a decoder selecting one or more word line driver circuits in the plurality of word line driver circuits.

14. The integrated circuit memory device of claim 13, wherein the load reduction circuit comprises a transistor including a control terminal, a first terminal, and a second terminal, and the control terminal coupled to the control input of the load reduction circuit, and the first terminal coupled to the input of the load reduction circuit, and the second terminal coupled to the output of the load reduction circuit.

15. The integrated circuit memory device of claim 14, wherein the driver circuit includes a transistor, and the transistor of the driver circuit has a threshold voltage, and the transistor of the load reduction circuit includes a threshold voltage, and the threshold voltage of the transistor of the load reduction circuit has a magnitude less than a magnitude of the threshold voltage of the transistor device included in the driver circuit.

16. The integrated circuit memory device of claim 13, wherein the control input of the load reduction circuit is coupled to a second voltage source, and the second voltage source providing a second voltage.

17. The integrated circuit memory device of claim 16, wherein the second voltage has a magnitude less than a magnitude of the first voltage.

18. The integrated circuit memory device of claim 13, wherein the driver circuit comprises an inverter.

19. The integrated circuit memory device of claim 13, wherein the feedback circuit comprises a transistor.

20. The integrated circuit memory device of claim 13, wherein the feedback circuit comprises an inverter.

21. The integrated circuit memory device of claim 13, wherein the first voltage is for a read operation.

22. The integrated circuit memory device of claim 13, wherein the voltage source comprises a charge pump.

23. An integrated circuit memory device, comprising:

a memory array, including a plurality of word lines coupled to memory cells in the array;

a plurality of address inputs adapted to receive addresses identifying selected memory cells in the array;

a voltage source;

a plurality of word line driver circuits, and the plurality of word line driver circuits capacitively loading the voltage source, and one or more word line driver circuits in the plurality of word line driver circuits comprising:

a driver circuit comprising:

a P-channel transistor including a gate terminal, a first terminal coupled to the voltage source, and a second terminal adapted for connection to a word line; and an N-channel transistor including a gate terminal, a first terminal, and a second terminal coupled to the second terminal of the P-channel transistor, wherein the word line driver circuit in a selected mode couples the word line to the voltage source, and the word line driver circuit in a deselected mode couples the word line to a reference potential of the first terminal of the N-channel transistor;

a feedback circuit comprising:

a P-channel transistor including a gate terminal coupled to the second terminal of the N-channel transistor of the driver circuit, a first terminal coupled to the voltage source, and a second terminal coupled to the gate of the P-channel transistor of the driver circuit; and a load reduction circuit comprising:

an N-channel transistor including a control terminal, a first terminal coupled to the second terminal of the P-channel transistor of the feedback circuit, and a second terminal coupled to the gate of the N-channel transistor of the driver circuit, wherein in the deselected mode the load reduction circuit reduces a capacitive load of the driver circuit on the voltage source; and a decoder selecting one or more word line driver circuits in the plurality of word line driver circuits.

24. The integrated circuit memory device of claim 23, wherein the feedback circuit further comprises:

an N-channel transistor including a gate terminal coupled to the second terminal of the N-channel transistor of the driver circuit, a first terminal coupled to the reference potential, and a second terminal coupled to the gate of the P-channel transistor of the driver circuit.

25. A method for lowering current consumption from a voltage source for a word line driver circuit in a deselected mode, the method comprising the acts of:

coupling a driver circuit to a feedback circuit to pass a voltage provided by the voltage source through the feedback circuit to an input of the driver circuit in the deselected mode; and reducing a capacitive load of the driver circuit on the voltage source.

26. The method of claim 25, wherein the reducing act further comprises the acts of:

coupling the feedback circuit to the input of the driver circuit with a load reduction circuit; and applying a reference voltage to a control input of the load reduction circuit, and the reference voltage having a magnitude less than a magnitude of the voltage provided by the voltage source, whereby the load reduction circuit transitions from a state of coupling a capacitance of the driver circuit to the voltage source to a state of decoupling the capacitance of the driver circuit from the voltage source.

* * * * *